US010681818B1

(12) United States Patent
Graber et al.

(10) Patent No.: US 10,681,818 B1
(45) Date of Patent: Jun. 9, 2020

(54) RING-SHAPED DEVICES WITH VOICE INTEGRATION

(71) Applicant: Amazon Technologies, Inc., Seattle, WA (US)

(72) Inventors: Sarah Graber, Seattle, WA (US); Sun Joo Han, San Francisco, CA (US); Bernhard Wildner, San Francisco, CA (US); Adrian Napoles, Bellevue, WA (US); Ulf Jan-Ove Mattsson, Campbell, CA (US); Felipe Varela, San Jose, CA (US); Albert John Yu Sam Chua, San Jose, CA (US); Brad Arnold, Redmond, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/208,200

(22) Filed: Dec. 3, 2018

(51) Int. Cl.
| | |
|---|---|
| *G06F 1/16* | (2006.01) |
| *H05K 1/18* | (2006.01) |
| *H05K 1/03* | (2006.01) |
| *H04R 1/02* | (2006.01) |
| *H04R 1/04* | (2006.01) |
| *H05K 1/11* | (2006.01) |

(52) U.S. Cl.
CPC .......... *H05K 1/189* (2013.01); *G06F 1/1698* (2013.01); *H04R 1/025* (2013.01); *H04R 1/04* (2013.01); *H05K 1/0393* (2013.01); *H05K 1/118* (2013.01)

(58) Field of Classification Search
None
See application file for complete search history.

(56) References Cited

U.S. PATENT DOCUMENTS

| | | | |
|---|---|---|---|
| 2015/0277559 A1* | 10/2015 | Vescovi | G06F 3/04883 345/173 |
| 2015/0287412 A1* | 10/2015 | Tang | A44C 9/0053 704/275 |
| 2016/0277872 A1* | 9/2016 | Ting | H04B 5/0031 |
| 2016/0292563 A1* | 10/2016 | Park | G06K 19/07762 |
| 2017/0150255 A1* | 5/2017 | Wang | G04G 21/06 |
| 2017/0207519 A1* | 7/2017 | Tzanidis | H01Q 1/38 |
| 2018/0261911 A1* | 9/2018 | Zhu | G04R 60/06 |

* cited by examiner

*Primary Examiner* — James K Mooney
(74) *Attorney, Agent, or Firm* — Eversheds Sutherland (US) LLP

(57) ABSTRACT

Systems, methods, and computer-readable media are disclosed for ring-shaped devices with voice integration. In one embodiment, an example device may include an antenna element that at least partially forms an outer surface of the ring-shaped device, an outer shell coupled to the antenna element, an inner shell coupled to the outer shell, a curved battery disposed along a first side of the ring-shaped device, and a flexible printed circuit assembly coupled to the curved battery and disposed along a second side of the ring shaped device.

20 Claims, 8 Drawing Sheets

RING-SHAPED DEVICES WITH VOICE INTEGRATION

BACKGROUND

Electronic devices may have microphones, speakers, and other components. Certain devices may be wearable devices, such as watches, glasses, and the like, and may be worn by users. However, certain devices may be bulky and/or have relatively large footprints, which may therefore make it difficult for users to wear such devices. In addition, performance of some electronic devices may be affected by the human body. As a result, devices with reduced footprints and/or smaller form factors, while maintaining functionality, may be desired.

Figure 1:
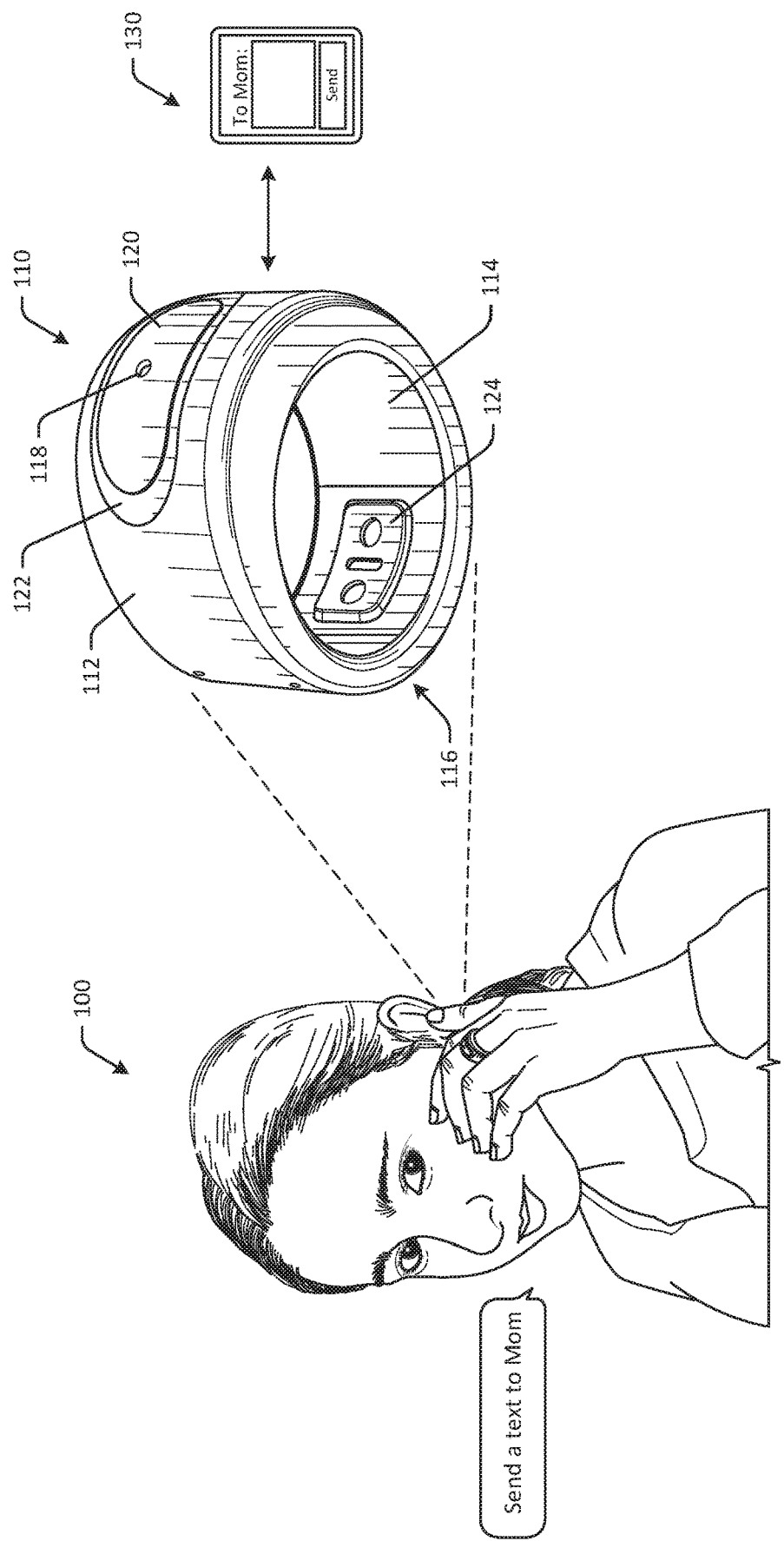
FIG. 1 is a schematic drawing of a ring-shaped device with voice integration and an example use case in accordance with one or more embodiments of the disclosure.

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may encompass, depending on the context, a plural number of such components or elements and vice versa.

DETAILED DESCRIPTION

Overview

Wearable devices may include electronic devices that a user can wear, for example, as an accessory, or can otherwise take with them, such as in the user's pocket. Wearable devices may include watches, bracelets, glasses, electronic trackers, and so forth. Because wearable devices may be worn by users, factors of the device including size, weight, shape, and the like may affect a user experience with the device. For example, a device that is bulky, heavy, or too large may be impractical for certain users to use or wear. In addition, reducing a size or footprint of a device may affect the functionality of the device. For example, reducing the size of a battery in the device may reduce an amount of time the device can operate without being recharged. Accordingly, a size, shape, weight, and/or other factors may impact not only a user experience with a wearable device, but functionality of the device as well.

Embodiments of the disclosure may include ring-shaped devices that are configured to detect voice input and to wirelessly communicate with other electronic devices. Different wearable devices may have different capabilities. For example, a wearable glasses device may be configured to provide augmented reality information on a display of the glasses. Embodiments of the disclosure include ring-shaped devices that may be worn by users as a ring around the user's finger. The ring-shaped devices may be configured to detect voice input and may be configured to wirelessly communicate with other electronic devices. For example, in some instances, a user may be unable or unwilling to take a smartphone out of the user's pocket or bag. However, the user may wish to set a timer, send a message, or perform another task. Using the ring-shaped devices described herein, the user may speak a voice command to the ring-shaped device, and the ring-shaped device may send the voice command to the user's smartphone or other device. The user may therefore not have to physically interact with the smartphone. Other examples of functionality include using the ring-shaped devices to control other electronic devices, such as televisions, stereos, content streaming devices, and so forth, sending voice messages, receiving information (e.g., audible presentation of a current time, etc.), and other functionality.

Because the user may wear the ring-shaped device around a finger, a size of the ring-shaped device may be limited. In addition, wireless performance of the ring-shaped device, such as transmission range, may be affected by contact between the ring-shaped device and adjacent fingers. For example, the nearby fingers may absorb radio waves transmitted by the ring-shaped device.

This disclosure relates to, among other things, systems, methods, computer-readable media, techniques, and methodologies for ring-shaped devices with voice integration. Embodiments may include devices that can be voice-controlled and/or voice activated, detect voice input, output audio content, control other electronic devices, send and receive wireless communications, and/or other operations. Some embodiments include an all-metal housing, and may include curved and/or flexible batteries and electronic components disposed within the housing. Certain embodiments may include noise-cancelling microphones, speakers, and/or other components.

Referring to FIG. 1, an example use case 100 with an example ring-shaped device 110 is depicted in accordance with one or more embodiments of the disclosure. In the illustrated example, a user may use the ring-shaped device 110 to communicate with another electronic device, such as a smartphone 130. To interact with the ring-shaped device 110, the user may, in some instances, interact with a button or other component of the ring-shaped device 110 to initiate monitoring for voice input. In other instances, the user may interact with the ring-shaped device 110 by speaking a wake word, such as "Alexa," or by making a certain gesture, such as lifting the user's hand towards the user's mouth. The ring-shaped device 110 may listen for a request or voice command, and may respond accordingly. For example, the ring-shaped device 110 may cause one or more operations to be performed, such as controlling other devices (e.g., televisions, lights, radios, thermostats, etc.), may respond with audio or visual information (e.g., weather, news, messages, etc.), and/or may perform different actions in response to a request or command.

The ring-shaped device 110 may include one or more microphones that may be used to detect voice input and/or generate a signal representing audio input. For example, in FIG. 1, the ring-shaped device 110 may include a first microphone 116 positioned at or near a bottom of the ring-shaped device 110, where the bottom of the ring-shaped device 110 may face the user's palm when the user makes a fist ("bottom," "top," "upper," "lower," and "side" as used herein describe relative positioning for illustrative examples and not absolute positioning). Accordingly, to speak into the first microphone 116, the user may raise the user's hand towards the user's mouth and may speak into or near the first microphone 116. In the example of FIG. 1, the user may say a voice command of "send a text to mom." The voice command may be detected by the first microphone 116 and may be sent, for example over a wireless connection (e.g., Bluetooth, Zigbee, WiFi, etc.) to the smartphone 130. The smartphone 130 may receive the voice command, and may initiate one or more actions. For example, the smartphone 130 may initiate a text message to "mom," as determined using a contact list associated with the smartphone 130 and/or the user. In some embodiments, the ring-shaped device 110 may include one or more speakers for audible feedback. For example, the speakers may present audible feedback such as "what would you like the message to say?"

The ring-shaped device 110 may include a second microphone 118 that may be aligned with an aperture in an antenna assembly disposed at a top portion of the ring-shaped device 110. The top portion may be on the backside of the user's hand. The second microphone 118 may be used for noise cancellation in some embodiments.

The ring-shaped device 110 may include an outer shell 112 and an inner shell 114. The outer shell 112 and the inner shell 114 may be formed of metal. For example, the outer shell 112 may be formed of titanium, and the inner shell 114 may be formed of a nickel-free stainless steel, such as a metal injection molded inner shell made from panacea metal. The outer shell 112 and the inner shell 114 may be glued together to form a housing of the ring-shaped device 110. In some embodiments, The ring-shaped device 110 may include an antenna 120 disposed along the top portion of the ring-shaped device 110. The antenna 120 may be formed of metal, such as titanium. The antenna 120 may be operable using a 2.4 GHz band, 5 GHz band, or any other suitable band. The antenna 120 may have an aperture extending through the antenna 120, where the second microphone 118 is aligned with the aperture. The antenna 120 may be separated from the outer shell 112 by a plastic carrier component 122. The plastic carrier component 122 may surround at least a portion of the antenna 120 and may create separation between the antenna 120 and the outer shell 112, thereby reducing a likelihood of interference caused by the outer shell 112. The ring-shaped device 110 may include a charging contact 124 that may be disposed along an inner surface of the ring-shaped device 110. The charging contact 124 may be used to couple the ring-shaped device 110 to a charging device to recharge a battery disposed within the ring-shaped device 110.

The ring-shaped device 110 may therefore be configured to operate in various environments, such as environments with ambient noise, while maintaining audible and/or visual interaction capabilities with users. Because the antenna 120 may be position along a top of the ring-shaped device 110, radio frequency currents may be moved away from the user's fingers, which may improve efficiency and bandwidth. In addition, the metal housing may reduce an amount of energy that can be absorbed by shielding the user's fingers (wearing the ring and adjacent fingers) from the fields generated by the antenna 120. An amount of power delivered to the antenna that is absorbed by the user's fingers may be reduced. As a result, the ring-shaped device 110 may have improved functionality while maintaining a relatively small form factor and aesthetically pleasing design Example embodiments of the disclosure provide a number of technical features or technical effects. For example, in accordance with example embodiments of the disclosure, certain embodiments of the disclosure may increase a bandwidth and/or efficiency of antenna systems used with ring-shaped devices, detect voice commands, determine meanings of voice commands, and/or initiate actions in response to voice commands. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of the embodiments disclosed herein are also within the scope of this disclosure. The above-described embodiments and additional and/or alternative embodiments of the disclosure will be described in detail hereinafter through reference to the accompanying drawings.

Illustrative Embodiments and Use Cases

Figure 2:
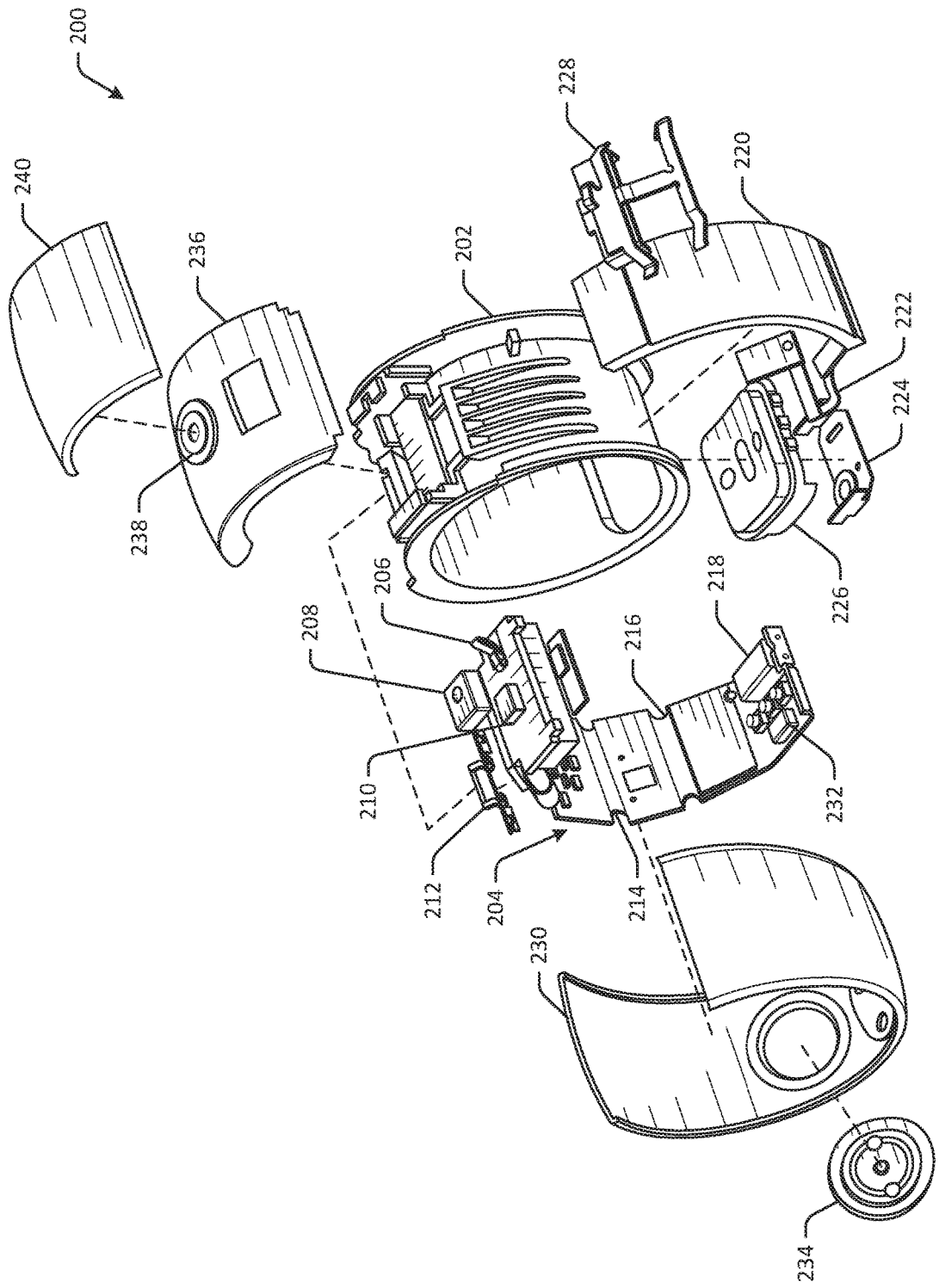
FIG. 2 is a schematic drawing of a ring-shaped device with voice integration in an exploded view in accordance with one or more embodiments of the disclosure.

FIG. 2 is a schematic drawing of a ring-shaped device 200 with voice integration in an exploded view in accordance with one or more embodiments of the disclosure. Other embodiments may include additional, fewer, and/or different components.

The ring-shaped device 200 may have a housing. The housing may be ring-shaped and/or substantially circular, and may be formed of one or more portions. For example, the housing may include an inner shell 202 and an outer shell 230. An antenna element 240 may form at least a portion of the housing, such as a top portion.

The ring-shaped device 200 may include the inner shell 202. The inner shell 202 may be in contact with a user's finger when the ring-shaped device 200 is worn by a user. The inner shell 202 may be formed of metal, such as stainless steel, and in some instances, may be formed of metal injection molded panacea material. The inner shell 202 may be formed of metal to improve biocompatibility and/or the feel of the ring-shaped device 200 to a user.

The inner shell 202 may be coupled to the outer shell 230. The outer shell 230 may be formed of a metal material, such as titanium. In some embodiments, the outer shell 230 may be formed of a stamped titanium material. The inner shell 202 may be disposed within the outer shell 230 and may be coupled using an adhesive, such as glue. In some embodiments, the inner shell 202 may be a circular inner shell, in that the outer surface of the inner shell 202 that is in contact with a user's finger during use may be circular or substantially circular. The circular portion of the inner shell 202 may form an inner surface of the housing of the ring-shaped device.

The antenna element 240 may be disposed along the top of the ring-shaped device 200 and may be formed of metal, such as a stamped titanium material. The antenna element 240 may form a portion of the outer surface of the housing of the ring-shaped device 200. The antenna element 240 may be a curved antenna element, so as to maintain a curvature of an outer surface of the ring-shaped housing. The outer shell 230 may be coupled to the curved antenna element 240. In some embodiments, one or more holes or apertures may be formed in the antenna element 240, and a microphone may be aligned with the one or more holes or apertures. In some embodiments, the inner shell 202, the outer shell 204, the antenna element 240, and/or an optional plastic carrier component may be glued together for structural sealing.

One or more components may be disposed within the housing of the ring-shaped device 200. For example, a flexible printed circuit assembly 204 may be disposed inside the housing along a first side of the ring-shaped device 200. A number of components may be coupled to or mounted on the flexible printed circuit assembly 204. For example, an antenna feed component 206 may be disposed at a first segment of the flexible printed circuit assembly 204. The antenna feed component 206 may couple the flexible printed circuit assembly 204 (and/or one or more components of the flexible printed circuit assembly 204) to the antenna element 240. In some embodiments, the antenna feed component 206 may be configured to electrically couple the flexible printed circuit assembly 204 to the antenna element 240. A first microphone 208 may be disposed on the flexible printed circuit assembly 204 adjacent to the antenna feed component 206. The first microphone 208 may be disposed at or near an upper portion of the ring-shaped device 200, and may therefore be used for noise cancellation, as a user may not wish to speak into the upper portion of the ring-shaped device 200 (e.g., the user may find doing so awkward, etc.). The first microphone 208 may be configured to cancel ambient noise. A haptic motor 210 may be disposed on the first segment of the flexible printed circuit assembly 204 adjacent to the antenna feed component 206. The haptic motor 210 may be configured to provide haptic or vibrational feedback to a user. A grounding spring 212 may be coupled to the flexible printed circuit assembly 204 and the inner shell 202 and/or outer shell 230 to provide grounding. In some embodiments, the grounding spring 212 may be coupled to a first flexible portion 214 of the flexible printed circuit assembly 204 between respective segments of the flexible printed circuit assembly 204. For example, the first flexible portion 214 may be positioned between a second segment and a third segment of the flexible printed circuit assembly 204, and a second flexible portion 216 may be positioned between the third segment and a fourth segment of the flexible printed circuit assembly 204. The grounding spring 212 may be used in conjunction with optional conductive foams disposed about the bend regions or flexible portions of the flexible printed circuit assembly 204. The bend regions or flexible portions may include exposed coverlay sections that provide access to cross-hatched copper ground, and the grounding spring 212 and/or conductive foams may couple the cross-hatched copper ground to the outer shell 230 and/or inner shell 202.

The antenna feed component 206, first microphone 208, and haptic motor 210 may be disposed on a first side of the flexible printed circuit assembly 204. The first side may be outward facing, or may face the outer shell 230 of the ring-shaped device 200. Additional components may be disposed on a second side of the flexible printed circuit assembly 204. The second side may be opposite the first side and may be, in some instances, inward facing, or may face the inner shell 202.

For example, a speaker assembly 218 may be disposed on the second side of the flexible printed circuit assembly 204. The speaker assembly 218 may be disposed on a segment of the flexible printed circuit assembly 204 that is at an opposite end of the flexible printed circuit assembly 204 with respect to the antenna feed component 206, in some embodiments.

The ring-shaped device 200 may include one or more microphones configured to detect sound and/or generate an audio signal. The microphones may be positioned within the housing and may correspond to the locations of one or more microphone holes on the housing. A second microphone 232 may be disposed adjacent to the speaker assembly 218. The second microphone 232 may be configured to detect voice input.

The flexible printed circuit assembly 204 may be coupled to a battery 220. The battery 220 may be a curved battery and may be configured to power the ring-shaped device 200. The battery 220 may be any suitable battery type, such as lithium ion, nickel cadmium, etc. the battery 220 may be rechargeable. The battery 220 may be disposed in the housing of the ring-shaped device 200 along a second side of the ring-shaped device 200, or along a side of the housing opposite the flexible printed circuit assembly 204. The battery 220 may be coupled to the flexible printed circuit assembly 204 using, for example, a flexible jumper component 222. The flexible jumper component 222 may be used to form an electrical connection between the battery 220 and the flexible printed circuit assembly 204, and may remove the need for soldering in some instances. The flexible jumper component 222 may be configured to electrically couple the flexible printed circuit assembly 204 and the curved battery 220, where the flexible jumper component 222 may be disposed between a first end of the flexible printed circuit assembly 204 and a second end of the curved battery 220.

A strap 226 may be included to couple the battery 220 to a charging contact assembly 226. The charging contact assembly 226 may include one or more charging contacts that can be used to electrically couple the ring-shaped device 200 to a charger in order to charge the battery 220. In some embodiments, the charging contacts may be inward facing (e.g., with respect to a center of the ring, etc.), while in other embodiments, the charging contacts may be outward facing (e.g., with respect to the outer shell 230, away from the ring, etc.). The charging contact assembly 226 may be coupled to the inner shell 202 and/or the outer shell 230. In some embodiments, the charging contact may be coupled to the inner shell 202 via the charging contact assembly 226, and the charging contact may be oriented in an inward facing orientation, or towards a center of the ring-shaped device 200. A grounding bridge 228 may be coupled to the battery 220 to provide grounding. The grounding bridge 228 may be coupled to the inner shell 202 and/or the outer shell 230.

A plastic carrier component 236, which may be a plastic bracket, may support the antenna element 240. The plastic carrier component 236 may include a curved body portion and one or more raised portions. The plastic carrier component 236 may at least partially separate the antenna element 240 from the outer shell 230 and/or the inner shell 202. For example, the plastic carrier component 236 may be disposed in the housing of the ring-shaped device 200 between the antenna element 240 and the inner shell 202, and may include raised portion(s) that are disposed between the antenna element 240 and the outer shell 230. In some embodiments, a portion of the plastic carrier component 236 may be externally visible. Accordingly, the plastic carrier component 236 may optionally form at least a portion of the outer surface of the housing of the ring-shaped device 200. A microphone vent seal 238 may be disposed on an outer surface of the plastic carrier component 236 and may provide sealing for the first microphone 208.

The ring-shaped device 200 may include one or more pressable or physical buttons. For example, the ring-shaped device 200 may include a button assembly 234 may be disposed along a lower portion of the housing of the ring-shaped device 200. The button assembly 234 may include one or more buttons that can be used, for example, to initiate a voice command to the ring-shaped device 200. The button assembly 234 may be coupled to the outer shell 230. Any number of buttons or manually configurable inputs may be included.

One or more audio ports and/or perforated holes for audio may be disposed on the outer shell 230 adjacent to the button assembly 234 and may allow for sound to exit the housing, but may prevent solid particle ingress. Microphone ports and/or speaker ports may be sealed using mesh and membrane to increase water resistance and/or for waterproofing.

Figure 3:
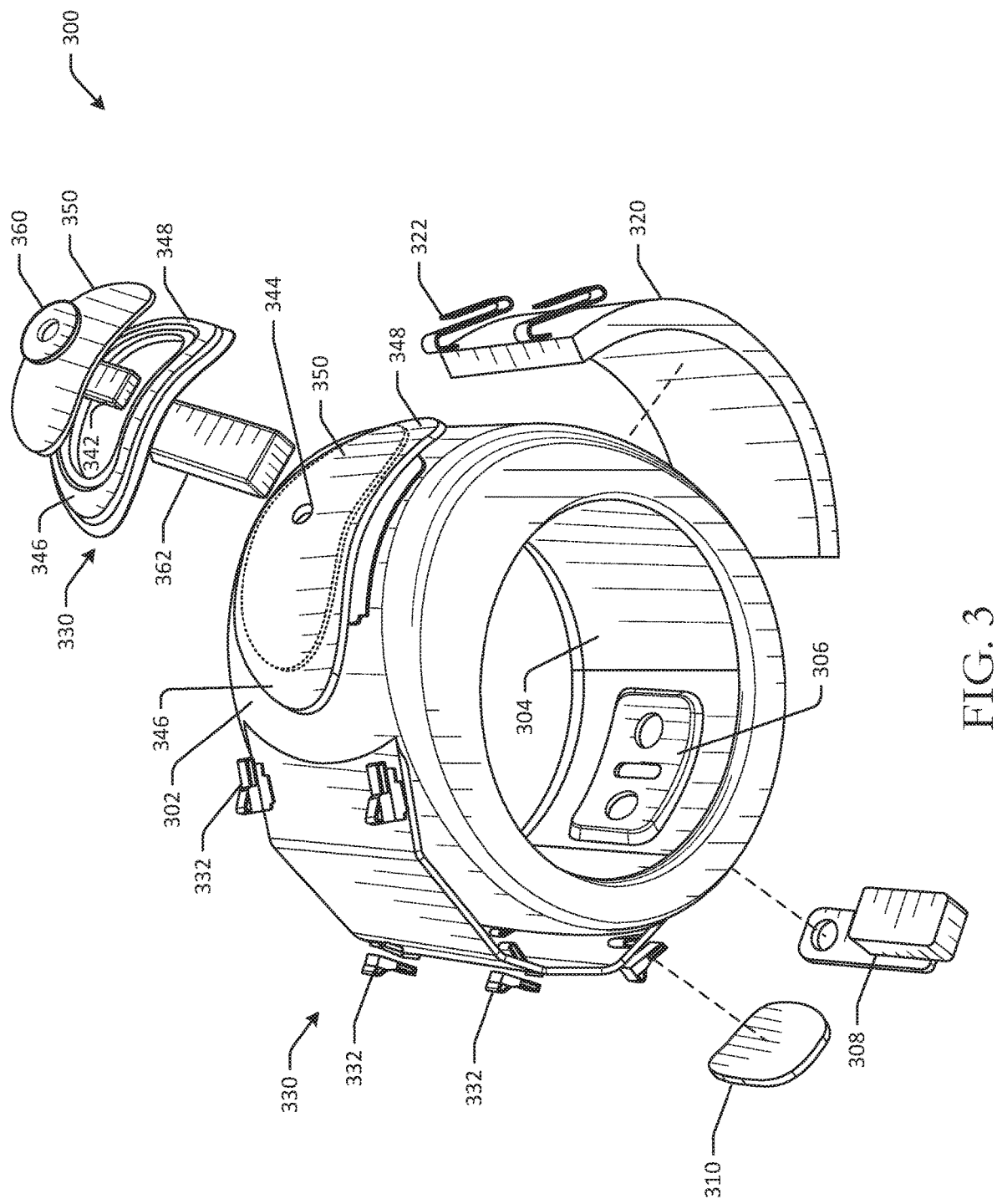
FIG. 3 is a schematic drawing of a ring-shaped device with voice integration in an exploded view in accordance with one or more embodiments of the disclosure.

FIG. 3 is a schematic drawing of a ring-shaped device 300 with voice integration in an exploded view in accordance with one or more embodiments of the disclosure. Other embodiments may include additional, fewer, and/or different components. FIG. 3 is a partial exploded perspective view of the ring-shaped device 300.

In the embodiment of FIG. 3, the ring-shaped device 300 may include components similar to those illustrated in FIG. 2. However, the geometry and configuration of the antenna element and plastic carrier component of the ring-shaped device 300 in FIG. 3 may be different than that of the embodiment illustrated in FIG. 2. In addition, various other components may be used, such as grounding clips instead of a grounding bridge.

In FIG. 3, the ring-shaped device 300 may have a housing. The housing may be ring-shaped and/or substantially circular, and may be formed of one or more portions. For example, the housing may include an inner shell 304 and an outer shell 302. An antenna element 350 may form at least a portion of the housing, such as a top portion.

The inner shell 304 may be formed of metal, such as stainless steel, and in some instances, may be formed of metal injection molded panacea material. The inner shell 304 may be formed of metal to improve biocompatibility and/or the feel of the ring-shaped device 300 to a user. The inner shell 304 may be coupled to the outer shell 302. The outer shell 302 may be formed of a metal material, such as titanium. In some embodiments, the outer shell 302 may be formed of a stamped titanium material. The inner shell 304 may be disposed within the outer shell 302 and may be coupled using an adhesive, such as glue. In some embodiments, the inner shell 304 may be a circular inner shell, in that the outer surface of the inner shell 304 that is in contact with a user's finger during use may be circular or substantially circular. The circular portion of the inner shell 304 may form an inner surface of the housing of the ring-shaped device.

The antenna element 350 may be disposed along the top of the ring-shaped device 300 and may be formed of metal, such as a stamped titanium material. The antenna element 350 may form a portion of the outer surface of the housing of the ring-shaped device 200. The antenna element 350 may be a curved antenna element, so as to maintain a curvature of an outer surface of the ring-shaped housing. The antenna element 350 may have an oval geometry in some embodiments, as opposed to the substantially rectangular geometry of the antenna element in FIG. 2. A microphone hole or aperture 344 may extend through the antenna element 350 and may be aligned with one or more microphones disposed within the housing. For example, a first microphone assembly 342 may include a first microphone for noise cancelation and/or voice input that may be aligned with the aperture 344. A seal 360 may be disposed about the aperture 344. The seal 360 may be mounted on an exterior or interior surface of the antenna element 350. A haptic motor 362 may be disposed adjacent to the first microphone assembly 342 and may be used to output vibrational feedback that may be felt by a user while wearing the ring-shaped device 300.

The outer shell 302 may be coupled to the curved antenna element 350. In some embodiments, one or more holes or apertures may be formed in the antenna element 350, and a microphone may be aligned with the one or more holes or apertures. In some embodiments, the inner shell 304, the outer shell 302, the antenna element 350, and/or an optional plastic carrier component may be glued together for structural sealing.

One or more components may be disposed within the housing of the ring-shaped device 300. For example, a flexible printed circuit assembly 330 may be disposed inside the housing along a first side of the ring-shaped device 300. A number of components may be coupled to or mounted on the flexible printed circuit assembly 330. For example, an antenna feed component, a first microphone, a second microphone, a haptic motor, and/or other components may be disposed on the flexible printed circuit assembly 330.

One or more grounding clips 332 may be coupled to the flexible printed circuit assembly 330 and/or the outer shell 302 to provide grounding. The grounding clips 332 may be coupled to the segments of the flexible printed circuit assembly 330 and/or to the flexible portions between segments.

A speaker and microphone assembly 308 may be disposed on the flexible printed circuit assembly 330 at a lower portion of the ring-shaped device 300. The speaker and microphone assembly 308 may include a speaker assembly and a second microphone for voice input. A charging contact assembly 306 may include one or more charging contacts that can be used to electrically couple the ring-shaped device 300 to a charger in order to charge a battery 320. In some embodiments, the charging contacts may be inward facing, while in other embodiments, the charging contacts may be outward facing. The charging contact assembly 306 may be coupled to the inner shell 304 and/or the outer shell 302. In some embodiments, the charging contact may be coupled to the inner shell 304 via the charging contact assembly 306, and the charging contact may be oriented in an inward facing orientation, or towards a center of the ring-shaped device 300.

The flexible printed circuit assembly 330 may be coupled to the battery 320. The battery 320 may be a curved battery and may be configured to power the ring-shaped device 300. The battery 320 may be any suitable battery type, such as lithium ion, nickel cadmium, etc. the battery 320 may be rechargeable. The battery 320 may be disposed in the housing of the ring-shaped device 300 along a second side of the ring-shaped device 300, or along a side of the housing opposite the flexible printed circuit assembly 330. The battery 320 may be coupled to the flexible printed circuit assembly 330 using, for example, a flexible jumper component.

One or more grounding clips 322 may be coupled to the battery 320 to provide grounding. The grounding clips 322 may be coupled to the inner shell 304 and/or the outer shell 302.

A plastic carrier component 340 may support the antenna element 350. The plastic carrier component 340 may include a curved body portion and one or more raised portions. The plastic carrier component 340 may at least partially separate the antenna element 350 from the outer shell 302 and/or the inner shell 304. For example, the plastic carrier component 340 may be disposed in the housing of the ring-shaped device 300 between the antenna element 350 and the inner shell 304, and may include raised portion(s) that are disposed between the antenna element 350 and the outer shell 302. For example, the plastic carrier component 340 may include a first raised portion 346 disposed between a first side of the antenna element 350 and the outer shell 302, and a second raised portion 348 disposed between a second side of the antenna element 350 and the outer shell 302. In some embodiments, a portion of the plastic carrier component 340 may be externally visible. Accordingly, the plastic carrier component 340 may optionally form at least a portion of the outer surface of the housing of the ring-shaped device 300.

The ring-shaped device 300 may include one or more pressable or physical buttons. For example, the ring-shaped device 300 may include a button assembly 310 that may be disposed along a lower portion of the housing of the ring-shaped device 300. The button assembly 310 may include one or more buttons that can be used, for example, to initiate a voice command to the ring-shaped device 300. The button assembly 310 may be coupled to the outer shell 302. Any number of buttons or manually configurable inputs may be included.

One or more audio ports and/or perforated holes for audio may be disposed on the outer shell 302 adjacent to the button assembly 310 and may allow for sound to exit the housing, but may prevent solid particle ingress. Microphone ports and/or speaker ports may be sealed using mesh and membrane to increase water resistance and/or for waterproofing.

Figure 4:
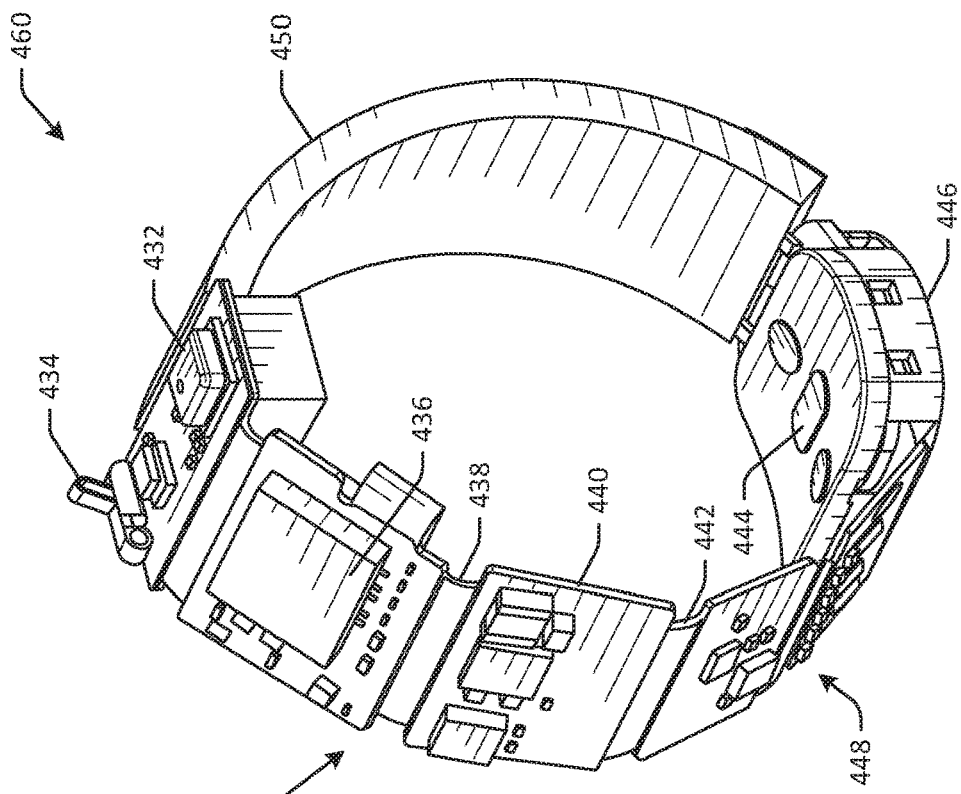
FIG. 4 is a schematic drawing of various components of a ring-shaped device with voice integration in various views in accordance with one or more embodiments of the disclosure.
Figure 4:
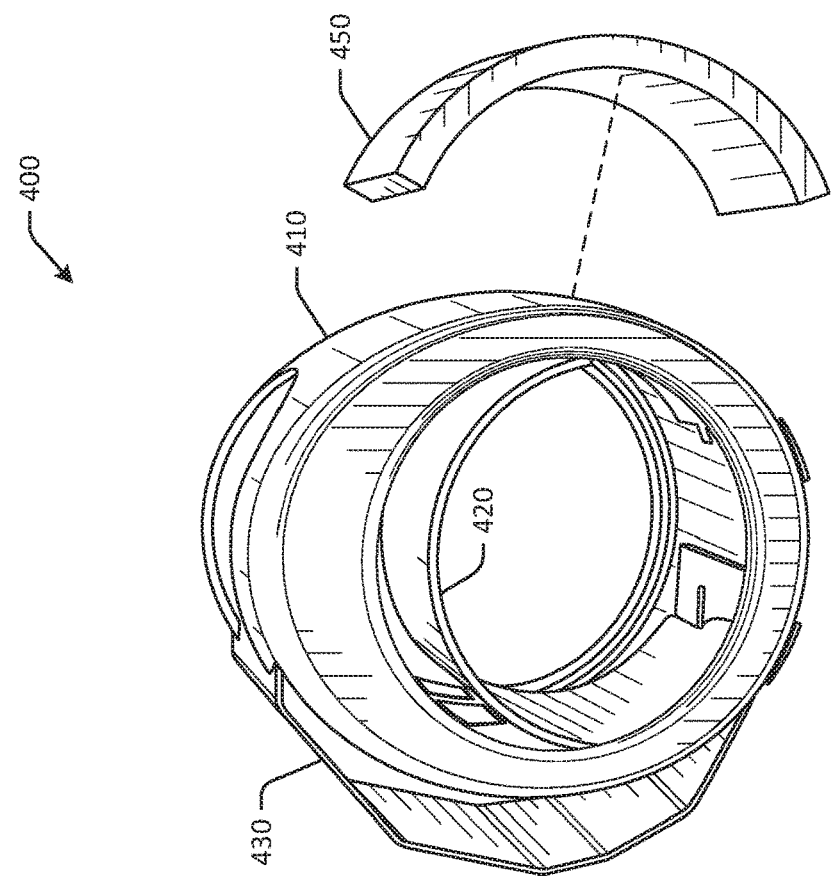

FIG. 4 is a schematic drawing of various components of a ring-shaped device with voice integration in various views in accordance with one or more embodiments of the disclosure. Other embodiments may include additional, fewer, and/or different components.

In a first illustration 400, a ring-shaped device is depicted with various components in a partially exploded view. The ring-shaped device includes an outer shell 410 and an inner shell 420 that fits within the outer shell 410 to form a housing of the ring-shaped device. A flexible printed circuit assembly 430 is disposed within a first side of the ring-shaped device, and a curved battery 450 is disposed within a second side of the ring-shaped device. The curved battery 450 may be flexible.

A second illustration 460 depicts the flexible printed circuit assembly 430 and the curved battery 450 coupled together. The flexible printed circuit assembly 430 may include an antenna feed 434 and a first microphone 432 disposed on a first segment of the flexible printed circuit assembly 430. The first segment may be positioned at an end of the flexible printed circuit assembly 430 and may be coupled to the curved battery 450. A system-on-a-chip 436 may be disposed on a second segment of the flexible printed circuit assembly 430. The system-on-a-chip 436 may include a Bluetooth radio in some instances.

A first connector portion 438, which may be flexible, may be disposed between the second segment and a third segment. In some embodiments, a ground contact that electrically couples the first connector portion 438 to the inner shell and/or the outer shell may be included.

A battery protection circuit 440 may be disposed on the third segment. A second connector portion 442, which may be flexible, may be disposed between the third segment and a fourth segment. In some embodiments, a ground contact that electrically couples the second connector portion 442 to the inner shell and/or the outer shell may be included. A charging contact assembly 446 may include charging contact 444 and may be disposed between an end of the flexible printed circuit assembly 430 and an end of the curved battery 450. A main logic board 448 may be disposed on a fourth segment and may include a number of components.

Figure 5:
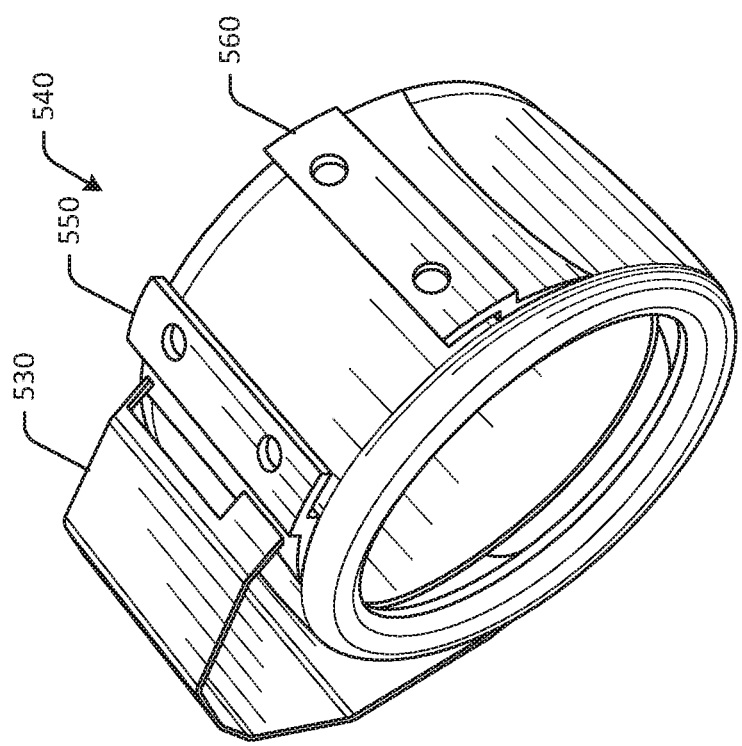
FIG. 5 is a schematic drawing of various components of a ring-shaped device with voice integration in various views in accordance with one or more embodiments of the disclosure.
Figure 5:
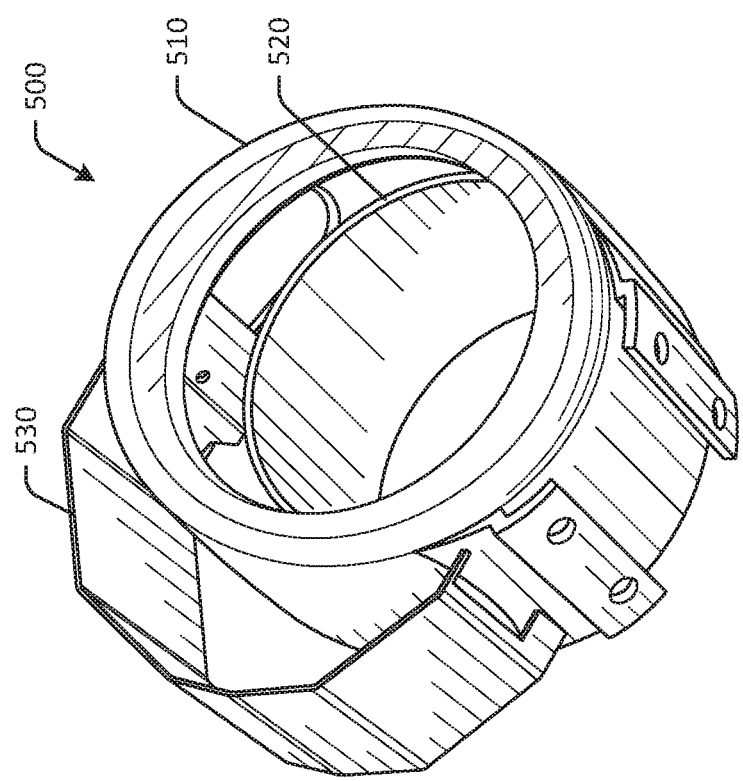

FIG. 5 is a schematic drawing of various components of a ring-shaped device with voice integration in various views in accordance with one or more embodiments of the disclosure. Other embodiments may include additional, fewer, and/or different components. The ring-shaped device of FIG. 5 may be the same ring-shaped device of FIG. 4.

As depicted in a first illustration 500, the ring-shaped device may include an outer shell 510 and an inner shell 520 that fits within the outer shell 510. Both the outer shell 510 and the inner shell 520 may be formed of metal. A flexible printed circuit assembly 530 may be disposed within a first side of the ring-shaped device, and a curved battery may be disposed at a second side of the ring-shaped device. The curved battery may be flexible.

In the second illustration 540, the ring-shaped device is illustrated in a bottom perspective view, and the inner shell 520 may include a first connector portion 550 and a second connector portion 560. The first connector portion 550 and the second connector portion 560 may be used to couple the charging contact assembly and/or to support the jumper flex component between the flexible printed circuit assembly 530 and battery. In some instances, the first connector portion 550 and the second connector portion 560 may be used to couple the inner shell 520 to the outer shell 510.

Figure 6:
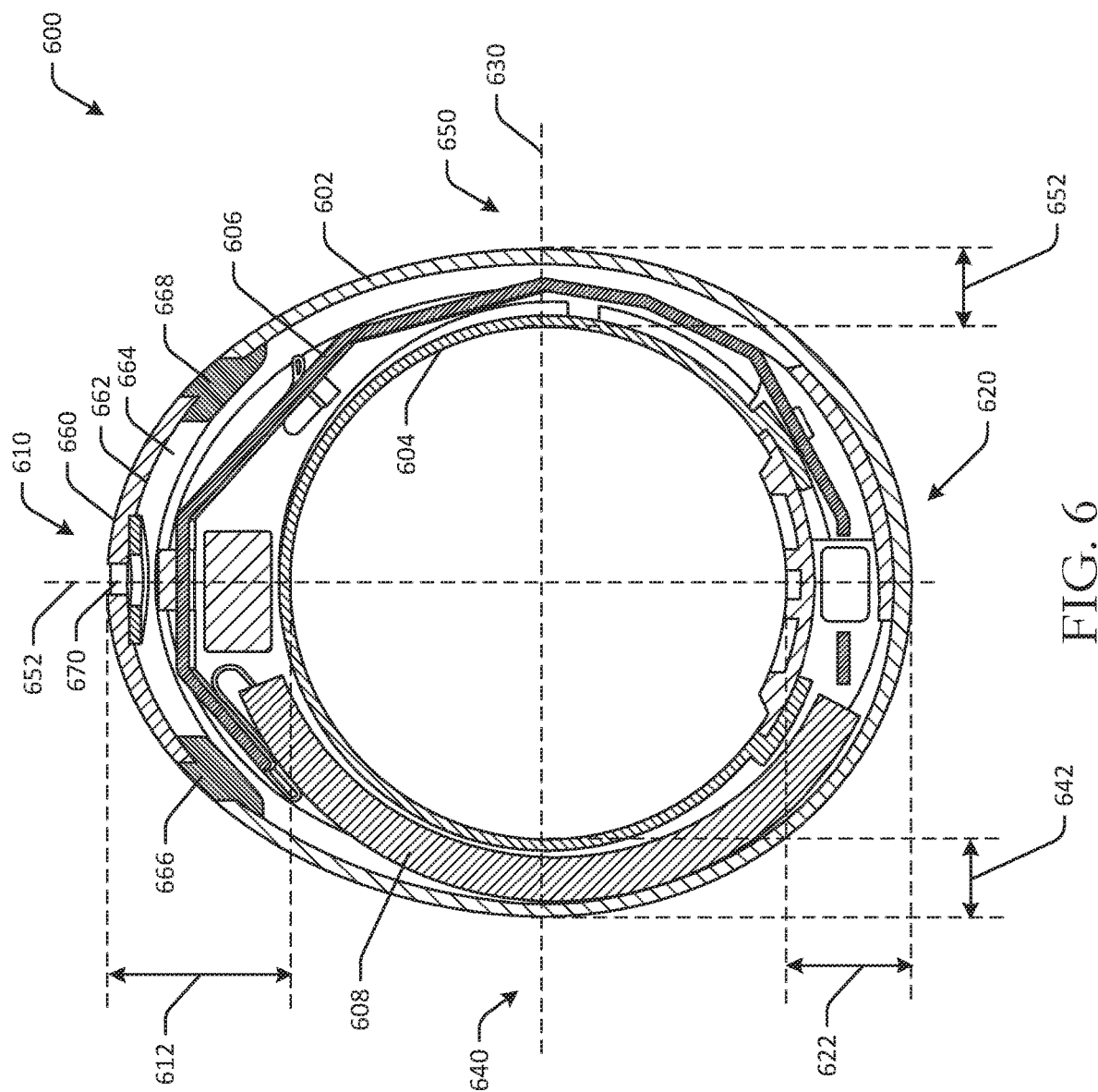
FIG. 6 is a schematic drawing of a ring-shaped device with voice integration in a cross-sectional view in accordance with one or more embodiments of the disclosure.

FIG. 6 is a schematic drawing of a ring-shaped device 600 with voice integration in a cross-sectional view in accordance with one or more embodiments of the disclosure. Other embodiments may include additional, fewer, and/or different components. The ring-shaped device of FIG. 6 may be the same ring-shaped device of FIG. 3.

The ring-shaped device 600 may have a housing that includes an upper portion 610, a lower portion 620, a first side 640, and a second side 650. The outer surface of the housing may be formed by a metal outer shell 602, such as a titanium outer shell, and the inner surface of the housing may be formed by a metal inner shell 604. A curved battery 608 and a flexible printed circuit assembly 606 may be coupled together and disposed within the housing of the ring-shaped device 600.

The upper portion 610 may be a portion of the ring-shaped device 600 that is defined by a horizontal axis 630 of the ring-shaped device 600. Specifically, the upper portion 610 may be on a first side of the horizontal axis 630, and the lower portion 620 may be on a second side of the horizontal axis 630. The horizontal axis 630 may be a central horizontal axis or plane. In some embodiments, the upper portion may include a portion of the outer surface of the ring-shaped device 600 formed by an antenna element 660. The antenna element 660 may be a curved antenna element that forms, at least partially, an outer surface of the upper portion 610 of the housing. A microphone hole or aperture 670 may extend through the antenna element 660. In some embodiments, the outer shell 602 may include an aperture for a second microphone disposed in the lower portion 620 of the housing.

The first side 640 may be a first curved side portion and the second side 650 may be a second curved side portion. The first side 640 and the second side 650 may be defined about a vertical axis 652 of the ring-shaped device 600. The vertical axis 652 may be a central vertical axis or plane.

The upper portion 610 may have a first thickness 612, as measured from an outer surface of the ring-shaped device 600 to an inner surface of the ring-shaped device 600. The lower portion 620 may have a second thickness 622, as measured from an outer surface of the ring-shaped device 600 to an inner surface of the ring-shaped device 600. The second thickness 622 may be less than the first thickness 612.

The first side 640 may have a third thickness 642, as measured from an outer surface of the ring-shaped device 600 to an inner surface of the ring-shaped device 600. The second side 650 may have a fourth thickness 652, as measured from an outer surface of the ring-shaped device 600 to an inner surface of the ring-shaped device 600. The third thickness 642 may be the same as the fourth thickness 652. In some embodiments, the third thickness 642 and/or the fourth thickness 652 may be less than or equal to the second thickness 622. The third thickness 642 and/or the fourth thickness 652 may be less than the first thickness 612. In some instances, the first thickness 612 may be greater than the second thickness 622, and the second thickness 622 may be greater than the third thickness 642 and the fourth thickness 652.

A plastic carrier component 662 may be disposed between the antenna element 660 and the inner shell 604. Specifically, the plastic carrier component 662 may include a curved body portion 664 that is disposed between the antenna element 660 and the inner shell 604. The plastic carrier component 662 may include a first raised portion 666 and a second raised portion 668. The first raised portion 666 and the second raised portion 668 may separate the antenna element 660 from the outer shell 602. For example, the first raised portion 666 may be externally visible and may physically separate the antenna element 660 from a first end of the outer shell 602, and the second raised portion 668 may be externally visible and may physically separate the antenna element 660 from a second end of the outer shell 602. Some embodiments may include one raised portion instead of two. Some embodiments may include more than two raised portions.

Figure 7:
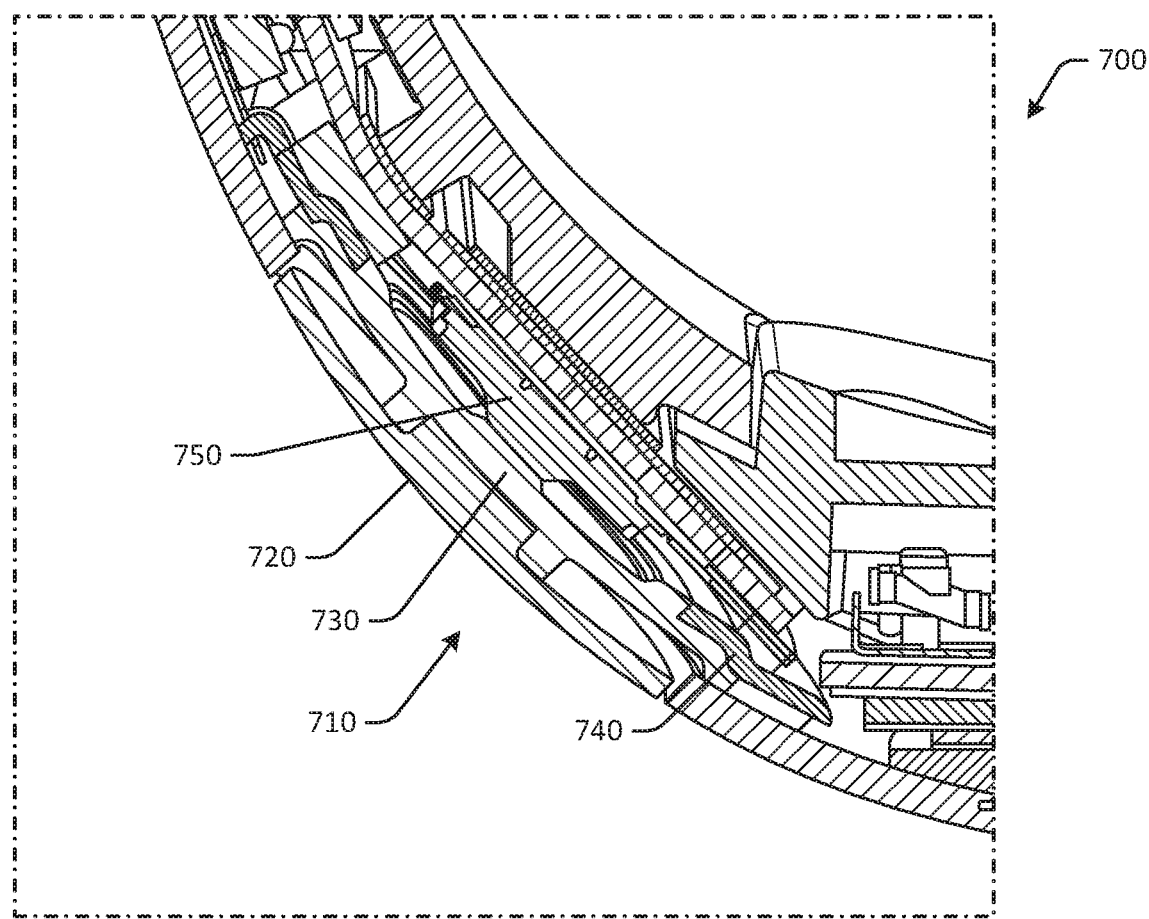
FIG. 7 is a schematic drawing of a button assembly of a ring-shaped device with voice integration in various views in accordance with one or more embodiments of the disclosure.
Figure 7:
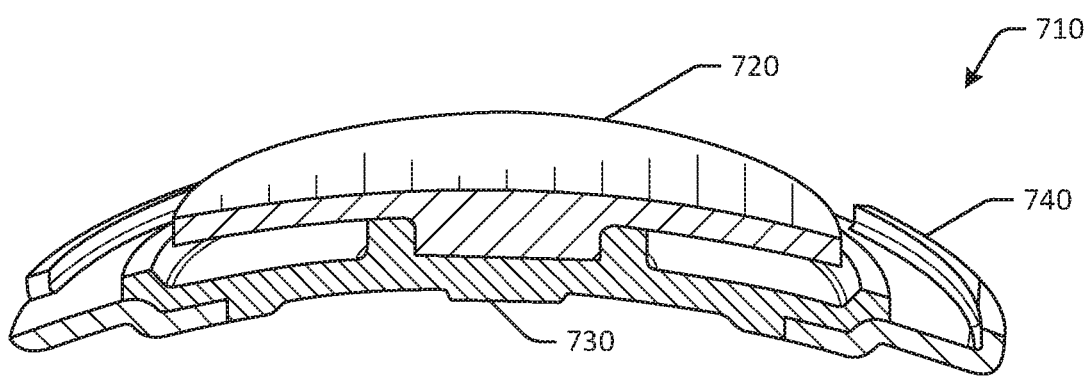

FIG. 7 is a schematic drawing of a button assembly 710 of a ring-shaped device 700 with voice integration in various views in accordance with one or more embodiments of the disclosure. Other embodiments may include additional, fewer, and/or different components. The ring-shaped device of FIG. 7 may be the same ring-shaped device of FIGS. 3 and 6.

The button assembly 710 may be slightly offset with respect to a central vertical axis or plane of the ring-shaped device (e.g., as depicted in FIG. 6, etc.). This may increase ease of use for users. The button assembly 710 may include one or more buttons that a user can engage in order to initiate a voice input or other communication. The button assembly 710 may be coupled to the outer shell and/or inner shell of the ring-shaped device 700. The button assembly 710 may be disposed along the lower portion of the housing.

The button assembly 710 may include a button portion 720, a rubber portion 730, and a frame 740. The button portion 720 may be a metal button and may be externally accessible. The rubber portion 730 may be formed of rubber, such as a silicone-based material. The frame 740 may be formed of metal. When depressed, the button portion 720 may deform the rubber portion 720 and may engage a switch 750 that may be disposed on the flexible printed circuit assembly of the ring-shaped device 700. The frame 740 may be a rubber overmold frame, and the button assembly 710 may have a thickness of approximately 1 millimeter in some embodiments.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by the execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Illustrative Device Architecture

Figure 8:
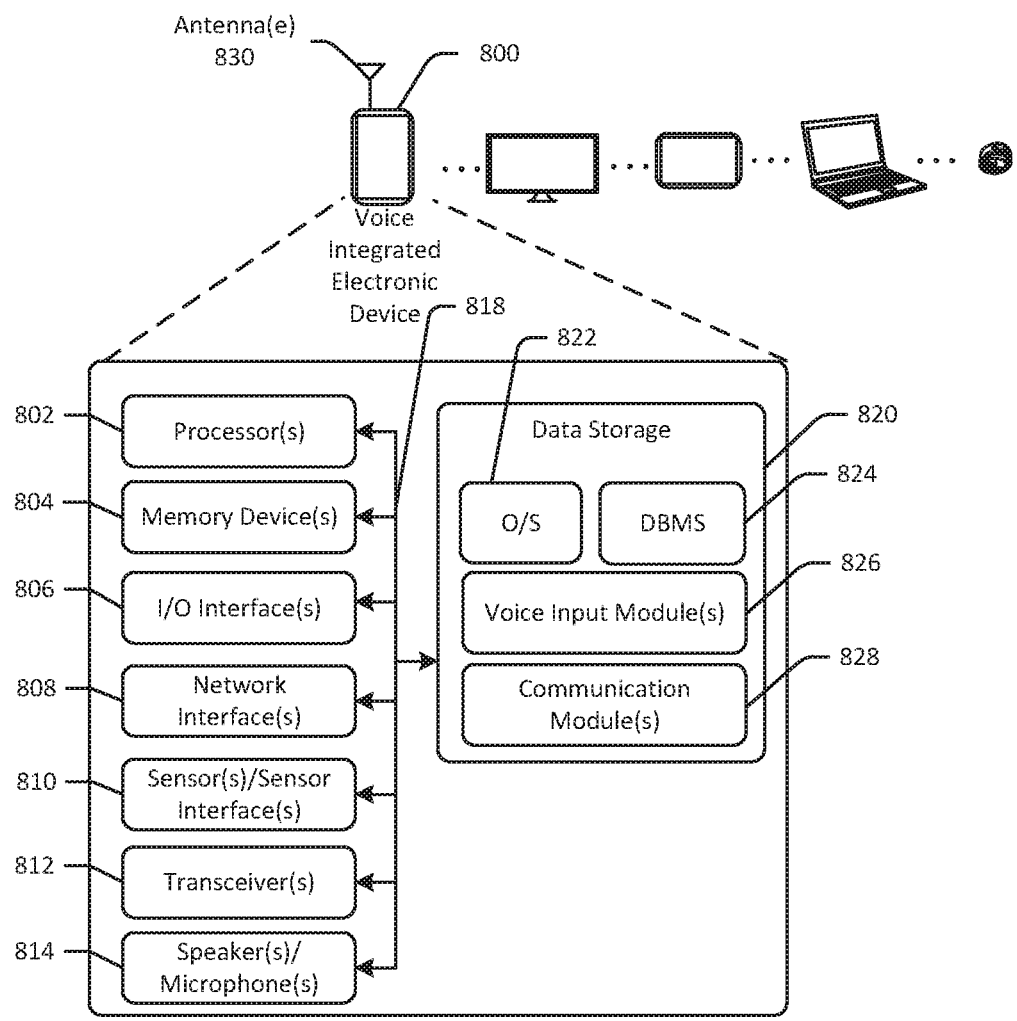
FIG. 8 schematically illustrates an example architecture of a ring-shaped device with voice integration in accordance with one or more embodiments of the disclosure.

FIG. 8 is a schematic block diagram of one or more illustrative voice integrated device(s) 800 in accordance with one or more example embodiments of the disclosure. The voice integrated device(s) 800 may include any suitable computing device with a ring-shaped housing with or without a display, in some instances, including, but not limited to, a server system, a mobile device, a wearable device, or the like; a content streaming device; a scanning device; a speaker device; or the like. The voice integrated device(s) 800 may correspond to an illustrative device configuration for the scanning device of FIGS. 1-7.

The voice integrated device(s) 800 may be configured to communicate with one or more servers, user devices, or the like. The voice integrated device(s) 800 may be configured to determine voice commands, determine wakeword utterances, determine and/or control other devices, and other operations. The voice integrated device(s) 800 may be configured to emit light, detect sound, output audio content, and other functionality.

The voice integrated device(s) 800 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the voice integrated device(s) 800 may include one or more processors (processor(s)) 802, one or more memory devices 804 (also referred to herein as memory 804), one or more input/output (I/O) interface(s) 806, one or more network interface(s) 808, one or more sensor(s) or sensor interface(s) 810, one or more transceiver(s) 812, one or more optional speakers and/or microphones 814, and data storage 820. The voice integrated device(s) 800 may further include one or more bus(es) 818 that functionally couple various components of the voice integrated device(s) 800. The voice integrated device(s) 800 may further include one or more antenna(e) 830 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 818 may include at least one of a system bus, a memory bus, an address bus, or a message bus, and may permit the exchange of information (e.g., data (including computer-executable code), signaling, etc.) between various components of the voice integrated device(s) 800. The bus(es) 818 may include, without limitation, a memory bus or a memory controller, a peripheral bus, an accelerated graphics port, and so forth. The bus(es) 818 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 804 of the voice integrated device(s) 800 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 804 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 804 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 820 may include removable storage and/or non-removable storage including, but not limited to, magnetic storage, optical disk storage, and/or tape storage. The data storage 820 may provide non-volatile storage of computer-executable instructions and other data. The memory 804 and the data storage 820, removable and/or non-removable, are examples of computer-readable storage media (CRSM) as that term is used herein.

The data storage 820 may store computer-executable code, instructions, or the like that may be loadable into the memory 804 and executable by the processor(s) 802 to cause the processor(s) 802 to perform or initiate various operations. The data storage 820 may additionally store data that may be copied to the memory 804 for use by the processor(s) 802 during the execution of the computer-executable instructions. Moreover, output data generated as a result of execution of the computer-executable instructions by the processor(s) 802 may be stored initially in the memory 804, and may ultimately be copied to the data storage 820 for non-volatile storage.

More specifically, the data storage 820 may store one or more operating systems (O/S) 822; one or more database management systems (DBMS) 824; and one or more program module(s), applications, engines, computer-executable code, scripts, or the like such as, for example, one or more voice input module(s) 826 and/or one or more communication module(s) 828. Some or all of these module(s) may be sub-module(s). Any of the components depicted as being stored in the data storage 820 may include any combination of software, firmware, and/or hardware. The software and/or firmware may include computer-executable code, instructions, or the like that may be loaded into the memory 804 for execution by one or more of the processor(s) 802. Any of the components depicted as being stored in the data storage 820 may support functionality described in reference to corresponding components named earlier in this disclosure.

The data storage 820 may further store various types of data utilized by the components of the voice integrated device(s) 800. Any data stored in the data storage 820 may be loaded into the memory 804 for use by the processor(s) 802 in executing computer-executable code. In addition, any data depicted as being stored in the data storage 820 may potentially be stored in one or more datastore(s) and may be accessed via the DBMS 824 and loaded in the memory 804 for use by the processor(s) 802 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like. In FIG. 8, an example datastore(s) may include, for example, speaker identification or user profile information, and/or other information.

The processor(s) 802 may be configured to access the memory 804 and execute the computer-executable instructions loaded therein. For example, the processor(s) 802 may be configured to execute the computer-executable instructions of the various program module(s), applications, engines, or the like of the voice integrated device(s) 800 to cause or facilitate various operations to be performed in accordance with one or more embodiments of the disclosure. The processor(s) 802 may include any suitable processing unit capable of accepting data as input, processing the input data in accordance with stored computer-executable instructions, and generating output data. The processor(s) 802 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 802 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 802 may be capable of supporting any of a variety of instruction sets.

Referring now to functionality supported by the various program module(s) depicted in FIG. 8, the voice input module(s) 826 may include computer-executable instructions, code, or the like that responsive to execution by one or more of the processor(s) 802 may perform functions including, but not limited to, detect sound, determine sound meanings, generate audio signals and audio data, determine a location of sound, and the like.

The communication module(s) 828 may include computer-executable instructions, code, or the like that responsive to execution by one or more of the processor(s) 802 may perform functions including, but not limited to, sending and/or receiving data, including content, sending and/or receiving instructions and commands, and the like.

Referring now to other illustrative components depicted as being stored in the data storage 820, the O/S 822 may be loaded from the data storage 820 into the memory 804 and may provide an interface between other application software executing on the voice integrated device(s) 800 and the hardware resources of the voice integrated device(s) 800. More specifically, the O/S 822 may include a set of computer-executable instructions for managing the hardware resources of the voice integrated device(s) 800 and for providing common services to other application programs (e.g., managing memory allocation among various application programs). In certain example embodiments, the O/S 822 may control execution of the other program module(s). The O/S 822 may include any operating system now known or which may be developed in the future including, but not limited to, any server operating system, any mainframe operating system, or any other proprietary or non-proprietary operating system.

The DBMS 824 may be loaded into the memory 804 and may support functionality for accessing, retrieving, storing, and/or manipulating data stored in the memory 804 and/or data stored in the data storage 820. The DBMS 824 may use any of a variety of database models (e.g., relational model, object model, etc.) and may support any of a variety of query languages. The DBMS 824 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the voice integrated device(s) 800 is a mobile device, the DBMS 824 may be any suitable lightweight DBMS optimized for performance on a mobile device.

Referring now to other illustrative components of the voice integrated device(s) 800, the input/output (I/O) interface(s) 806 may facilitate the receipt of input information by the voice integrated device(s) 800 from one or more I/O devices as well as the output of information from the voice integrated device(s) 800 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the voice integrated device(s) 800 or may be separate. The I/O devices may further include, for example, any number of peripheral devices such as data storage devices, printing devices, and so forth.

The I/O interface(s) 806 may also include an interface for an external peripheral device connection such as universal serial bus (USB), FireWire, Thunderbolt, Ethernet port or other connection protocol that may connect to one or more networks. The I/O interface(s) 806 may also include a connection to one or more of the antenna(e) 830 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, etc.

The voice integrated device(s) 800 may further include one or more network interface(s) 808 via which the voice integrated device(s) 800 may communicate with any of a variety of other systems, platforms, networks, devices, and so forth. The network interface(s) 808 may enable communication, for example, with one or more wireless routers, one or more host servers, one or more web servers, and the like via one or more networks.

The antenna(e) 830 may include any suitable type of antenna depending, for example, on the communications protocols used to transmit or receive signals via the antenna(e) 830. Non-limiting examples of suitable antennae may include directional antennae, non-directional antennae, dipole antennae, folded dipole antennae, patch antennae, multiple-input multiple-output (MIMO) antennae, or the like. The antenna(e) 830 may be communicatively coupled to one or more transceivers 812 or radio components to which or from which signals may be transmitted or received.

As previously described, the antenna(e) 830 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(e) 830 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(e) 830 may be configured to transmit or receive radio frequency signals within any suitable frequency range forming part of the unlicensed portion of the radio spectrum.

The antenna(e) 830 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 812 may include any suitable radio component(s) for—in cooperation with the antenna(e) 830—transmitting or receiving radio frequency (RF) signals in the bandwidth and/or channels corresponding to the communications protocols utilized by the voice integrated device(s) 800 to communicate with other devices. The transceiver(s) 812 may include hardware, software, and/or firmware for modulating, transmitting, or receiving—potentially in cooperation with any of antenna(e) 830—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 812 may further include hardware, firmware, or software for receiving GNSS signals. The transceiver(s) 812 may include any known receiver and baseband suitable for communicating via the communications protocols utilized by the voice integrated device(s) 800. The transceiver(s) 812 may further include a low noise amplifier (LNA), additional signal amplifiers, an analog-to-digital (A/D) converter, one or more buffers, a digital baseband, or the like.

The sensor(s)/sensor interface(s) 810 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The optional speaker(s) and/or microphone(s) 814 may include any device configured to output audio. The optional microphone(s) 816 may be any device configured to receive analog sound input or voice data.

It should be appreciated that the program module(s), applications, computer-executable instructions, code, or the like depicted in FIG. 8 as being stored in the data storage 820 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the voice integrated device(s) 800, and/or hosted on other computing device(s) accessible via one or more networks, may be provided to support functionality provided by the program module(s), applications, or computer-executable code depicted in FIG. 8 and/or additional or alternate functionality. Further, functionality may be modularized differently such that processing described as being supported collectively by the collection of program module(s) depicted in FIG. 8 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 8 may be implemented, at least partially, in hardware and/or firmware across any number of devices.

It should further be appreciated that the voice integrated device(s) 800 may include alternate and/or additional hardware, software, or firmware components beyond those described or depicted without departing from the scope of the disclosure. More particularly, it should be appreciated that software, firmware, or hardware components depicted as forming part of the voice integrated device(s) 800 are merely illustrative and that some components may not be present or additional components may be provided in various embodiments. While various illustrative program module(s) have been depicted and described as software module(s) stored in the data storage 820, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

One or more operations of the methods, process flows, and/or use cases of FIGS. 1-7 may be performed by a device having the illustrative configuration depicted in FIG. 8, or more specifically, by one or more engines, program module(s), applications, or the like executable on such a device. It should be appreciated, however, that such operations may be implemented in connection with numerous other device configurations.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:
1. A ring-shaped device comprising:
  a housing comprising an upper portion, a curved lower portion, a first curved side portion, and a second curved side portion, wherein the housing comprises a titanium outer shell and a circular stainless steel inner shell;

a curved antenna element that forms an outer surface of the upper portion of the housing, the curved antenna element comprising a first microphone hole extending through the curved antenna element;

a plastic carrier that separates the titanium outer shell from the circular stainless steel inner shell, and separates the curved antenna element from the titanium outer shell;

a flexible printed circuit assembly coupled to the curved antenna element and disposed within the first curved side portion of the housing, the flexible printed circuit assembly comprising a first microphone configured to cancel ambient noise, a second microphone configured to receive voice input, a speaker assembly, and a switch, wherein the first microphone is aligned with the first microphone hole, and wherein the second microphone and the speaker assembly are disposed within the curved lower portion of the housing;

a curved battery coupled to the flexible printed circuit assembly and disposed within the second curved side portion of the housing; and a button assembly disposed along the curved lower portion of the housing, the button assembly comprising an externally accessible metal button configured to engage the switch on the flexible printed circuit assembly.

2. The ring-shaped device of claim 1, wherein the titanium outer shell is coupled to the curved antenna element and forms an outer surface of the first curved side portion, the curved lower portion, and the second curved side portion of the housing; and wherein the circular stainless steel inner shell is coupled to the titanium outer shell and forms an inner surface of the housing.

3. The ring-shaped device of claim 2, wherein the plastic carrier comprises a curved body, a first raised portion at a first end, and a second raised portion at a second end;

wherein the curved body is disposed between the titanium outer shell and the circular stainless steel inner shell, and wherein the first raised portion is disposed between the curved antenna element and a first end of the titanium outer shell, and the second raised portion is disposed between the curved antenna element and a second end of the titanium outer shell.

4. The ring-shaped device of claim 1, wherein a first thickness of the curved lower portion of the housing is equal to a second thickness of the first curved side portion and a third thickness of the second curved portion, and wherein the first thickness, the second thickness, and the third thickness are less than a fourth thickness of the upper portion of the housing.

5. A ring-shaped device comprising:
an antenna element that at least partially forms an outer surface of the ring-shaped device;
an outer shell coupled to the antenna element;
an inner shell coupled to the outer shell;
a plastic carrier that separates the outer shell from the inner shell, and separates the antenna element from the outer shell;
a curved battery disposed along a first side of the ring-shaped device; and
a flexible printed circuit assembly coupled to the curved battery and disposed along a second side of the ring shaped device.

6. The ring-shaped device of claim 5, wherein the antenna element comprises a first aperture, and the outer shell comprises a second aperture, and wherein the flexible printed circuit assembly comprises:

a first microphone aligned with the first aperture; and
a second microphone aligned with the second aperture.

7. The ring-shaped device of claim 6, wherein the first microphone is disposed along an upper portion of the ring-shaped device, and the second microphone is disposed along a lower portion of the ring-shaped device.

8. The ring-shaped device of claim 6, wherein the flexible printed circuit assembly further comprises:

an antenna feed component disposed adjacent to the first microphone, the antenna feed component configured to electrically couple the flexible printed circuit assembly to the antenna element.

9. The ring-shaped device of claim 6, further comprising:
a speaker assembly disposed adjacent to the second microphone; and
a flexible jumper component configured to electrically couple the flexible printed circuit assembly and the curved battery.

10. The ring-shaped device of claim 5, wherein the inner shell is a circular inner shell, and wherein the first side and the second side have a first thickness that is less than a second thickness of an upper portion of the ring-shaped device.

11. The ring-shaped device of claim 5, wherein the flexible printed circuit assembly comprises:
a first segment;
a second segment;
a connector portion disposed between the first segment and the second segment;
a first ground contact that electrically couples the connector portion to the inner shell; and
a second ground contact that electrically couples the connector portion to the outer shell.

12. The ring-shaped device of claim 5, wherein the plastic carrier comprises:
a curved portion disposed between the antenna element and the inner shell;
a first raised portion disposed between a first side of the antenna element and the outer shell; and
a second raised portion disposed between a second side of the antenna element and the outer shell.

13. The ring-shaped device of claim 5, further comprising:
a button assembly coupled to the outer shell, the button assembly comprising a metal button portion and a rubber portion.

14. The ring-shaped device of claim 5, further comprising:
a charging contact coupled to the inner shell, wherein the charging contact is oriented in an inward facing orientation with respect to a center of the ring-shaped device.

15. The ring-shaped device of claim 5, wherein the antenna element is a curved antenna element, and wherein the outer shell is a titanium outer shell and the inner shell is a metal inner shell.

16. A device comprising:
a ring-shaped housing comprising an outer shell, an inner shell, and an antenna element;
a plastic carrier that separates the outer shell from the inner shell, and separates the antenna element from the outer shell;
a curved battery disposed in a first side of the ring-shaped housing;
a flexible printed circuit assembly disposed in a second side of the ring shaped housing; and
a first microphone disposed along a lower portion of the ring-shaped housing.

17. The device of claim 16, wherein a first thickness of the first side of the ring-shaped housing is less than a second thickness of the lower portion of the ring-shaped housing.

18. The device of claim 16, further comprising:
a second microphone disposed along an upper portion of the ring-shaped housing, wherein the first microphone is configured to receive voice input, and wherein the second microphone is configured for noise cancellation.

19. The device of claim 16, wherein the antenna element is a curved antenna element that forms an outer surface of an upper portion of the ring-shaped housing.

20. The device of claim 16, wherein the device is configured to send and receive wireless communications.

* * * * *